(12) United States Patent
Nakayama et al.

(10) Patent No.: US 10,507,656 B2
(45) Date of Patent: Dec. 17, 2019

(54) PIEZOELECTRIC DEVICE, LIQUID EJECTING HEAD, AND LIQUID EJECTING APPARATUS

(71) Applicant: SEIKO EPSON CORPORATION, Tokyo (JP)

(72) Inventors: Masao Nakayama, Shiojiri (JP); Motoki Takabe, Shiojiri (JP); Eiju Hirai, Azumino (JP); Shiro Yazaki, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/024,466

(22) Filed: Jun. 29, 2018

(65) Prior Publication Data
US 2019/0009538 A1  Jan. 10, 2019

(30) Foreign Application Priority Data

Jul. 6, 2017 (JP) .................................. 2017-132519
Apr. 17, 2018 (JP) ................................ 2018-078914

(51) Int. Cl.
*B41J 2/14* (2006.01)
*H01L 41/047* (2006.01)

(52) U.S. Cl.
CPC ....... *B41J 2/14209* (2013.01); *B41J 2/14233* (2013.01); *H01L 41/0472* (2013.01); *B41J 2002/14241* (2013.01); *B41J 2002/14403* (2013.01); *B41J 2002/14419* (2013.01); *B41J 2002/14491* (2013.01); *B41J 2202/03* (2013.01)

(58) Field of Classification Search
None
See application file for complete search history.

(56) References Cited

U.S. PATENT DOCUMENTS

| | | |
|---|---|---|
| 2003/0058310 A1 | 3/2003 | Murai |
| 2009/0197009 A1 | 8/2009 | Sugahara |
| 2012/0320131 A1 | 12/2012 | Kato et al. |

(Continued)

FOREIGN PATENT DOCUMENTS

| | | |
|---|---|---|
| JP | 2004034417 A | 2/2004 |
| JP | 2013-000993 A | 1/2013 |
| JP | 2014198406 A | 10/2014 |

OTHER PUBLICATIONS

European Search Report issued in Application No. 18182035 dated Nov. 12, 2018.

*Primary Examiner* — Erica S Lin
(74) *Attorney, Agent, or Firm* — Workman Nydegger

(57) ABSTRACT

A piezoelectric device used in a liquid ejecting head that ejects a liquid from a nozzle includes a flow-path-forming substrate in which an individual liquid chamber that communicates with the nozzle and a liquid supply chamber that communicates with the individual liquid chamber are formed, a vibration plate formed at a position corresponding to the individual liquid chamber and the liquid supply chamber of the flow-path-forming substrate, a plurality of liquid supply ports formed in the liquid supply chamber, and a piezoelectric element including a first electrode, a piezoelectric layer, and a second electrode, the piezoelectric element being formed at a position on the vibration plate corresponding to the individual liquid chamber, where the liquid supply ports are provided so as to penetrate the vibration plate, and where the vibration plate contains zirconium oxide.

20 Claims, 5 Drawing Sheets

(56) References Cited

U.S. PATENT DOCUMENTS

2013/0258000 A1 10/2013 Ohashi et al.
2014/0111582 A1* 4/2014 Ohashi ............... H01L 41/0815
　　　　　　　　　　　　　　　　　　　347/70

* cited by examiner

FIG. 4
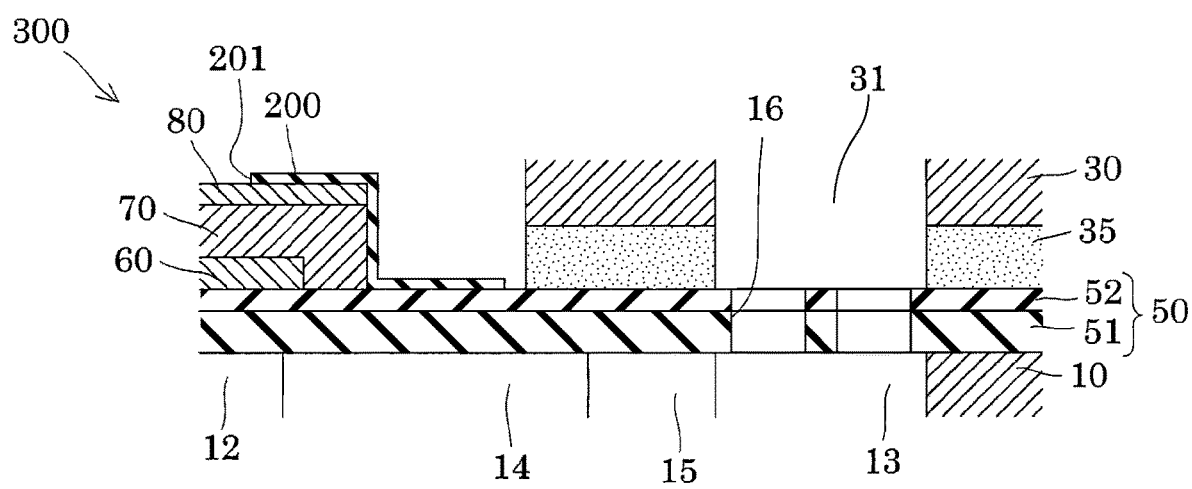
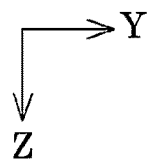

PIEZOELECTRIC DEVICE, LIQUID EJECTING HEAD, AND LIQUID EJECTING APPARATUS

BACKGROUND

1. Technical Field

The present invention relates to a piezoelectric device including a piezoelectric element, a liquid ejecting head including the piezoelectric device, and a liquid ejecting apparatus provided with the liquid ejecting head.

2. Related Art

An example of a piezoelectric device used in an ink jet recording head, which is a typical example of a liquid ejecting head, is a piezoelectric device including a flow-path-forming substrate provided with an individual flow path communicating with a nozzle and provided with a liquid supply chamber communicating with the individual flow path, and a piezoelectric element provided on one surface side of the flow-path-forming substrate via a vibration plate.

A configuration has been disclosed for an ink jet recording head having such a piezoelectric device in which a plurality of liquid supply ports communicating with a liquid supply chamber are provided on a vibration plate, which allows the vibration plate to have a filter function (see, for example, JP-A-2013-000993).

However, in the case where liquid supply ports are formed in the vibration plate, there is a problem that the vibration plate is easily damaged because ink supply pressure is applied to the vibration plate.

Therefore, in JP-A-2013-000993, the vibration plate that forms the liquid supply port is formed by stacking many layers, whereby the internal stress of the vibration plate is regulated in order to suppress the damage to the vibration plate. However, when a large number of layers are stacked on one another and the vibration plate becomes thick, the flexure of the piezoelectric element is impeded and the displacement characteristic deteriorates.

Further, such a problem exists not only in the ink jet recording head but also in a piezoelectric device used in a liquid ejecting head which ejects a liquid other than ink.

SUMMARY

An advantage of some aspects of the invention is that a piezoelectric device, a liquid ejecting head, and a liquid ejecting apparatus in which damage to a film around liquid supply ports is suppressed without impeding displacement of the piezoelectric element are provided.

A piezoelectric device according to a first aspect of the invention used in a liquid ejecting head that ejects a liquid from a nozzle includes a flow-path-forming substrate in which an individual liquid chamber that communicates with the nozzle and a liquid supply chamber that communicates with the individual liquid chamber are formed, a vibration plate formed at a position corresponding to the individual liquid chamber and the liquid supply chamber of the flow-path-forming substrate, a plurality of liquid supply ports formed in the liquid supply chamber, and a piezoelectric element including a first electrode, a piezoelectric layer, and a second electrode, the piezoelectric element being formed at a position on the vibration plate corresponding to the individual liquid chamber, where the liquid supply ports are provided so as to penetrate the vibration plate, and where the vibration plate contains zirconium oxide.

A liquid ejecting head according to a second aspect of the invention includes the piezoelectric device of the first aspect.

A liquid ejecting apparatus according to a third aspect of the invention includes the liquid ejecting head according to the second aspect.

BRIEF DESCRIPTION OF THE DRAWINGS

The invention will be described with reference to the accompanying drawings, wherein like numbers reference like elements.

FIG. 4 is an enlarged cross-sectional view of a main portion of the recording head.

DESCRIPTION OF EXEMPLARY EMBODIMENTS

Figure 1:
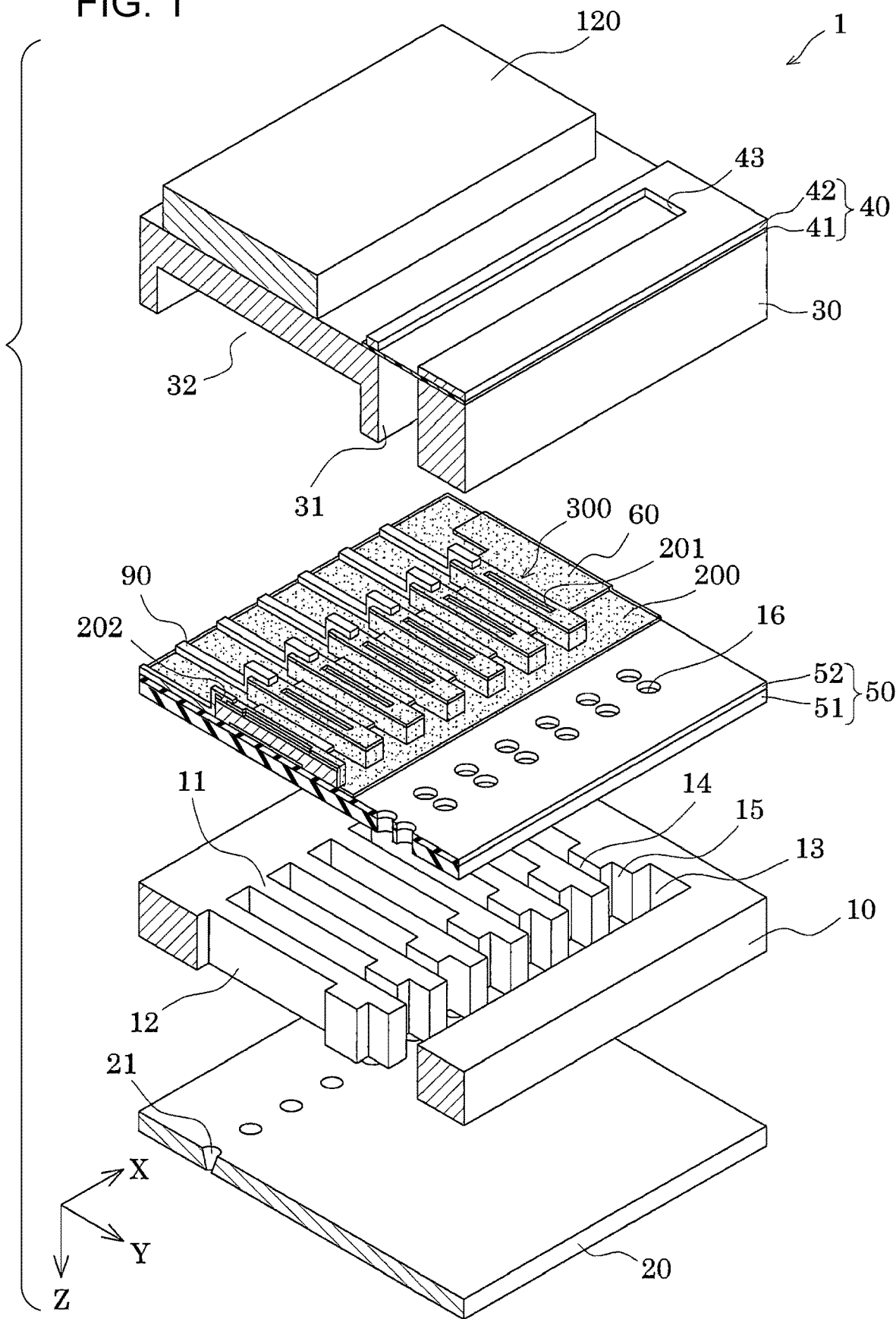
FIG. 1 is an exploded perspective view of a recording head according to an embodiment of the invention.

Hereinafter, embodiments of the invention will be described with reference to the drawings. However, the following description merely illustrates an embodiment of the invention, and it can be arbitrarily changed within the scope of the invention. In addition, in the drawings, the same reference numerals are given to the same members, and explanations thereof are omitted as appropriate. In each figure, X, Y, and Z represent three spatial axes orthogonal to each other. In the present specification, directions along these axes will be described as a first direction X, a second direction Y, and a third direction Z.

Embodiment

Figure 2:
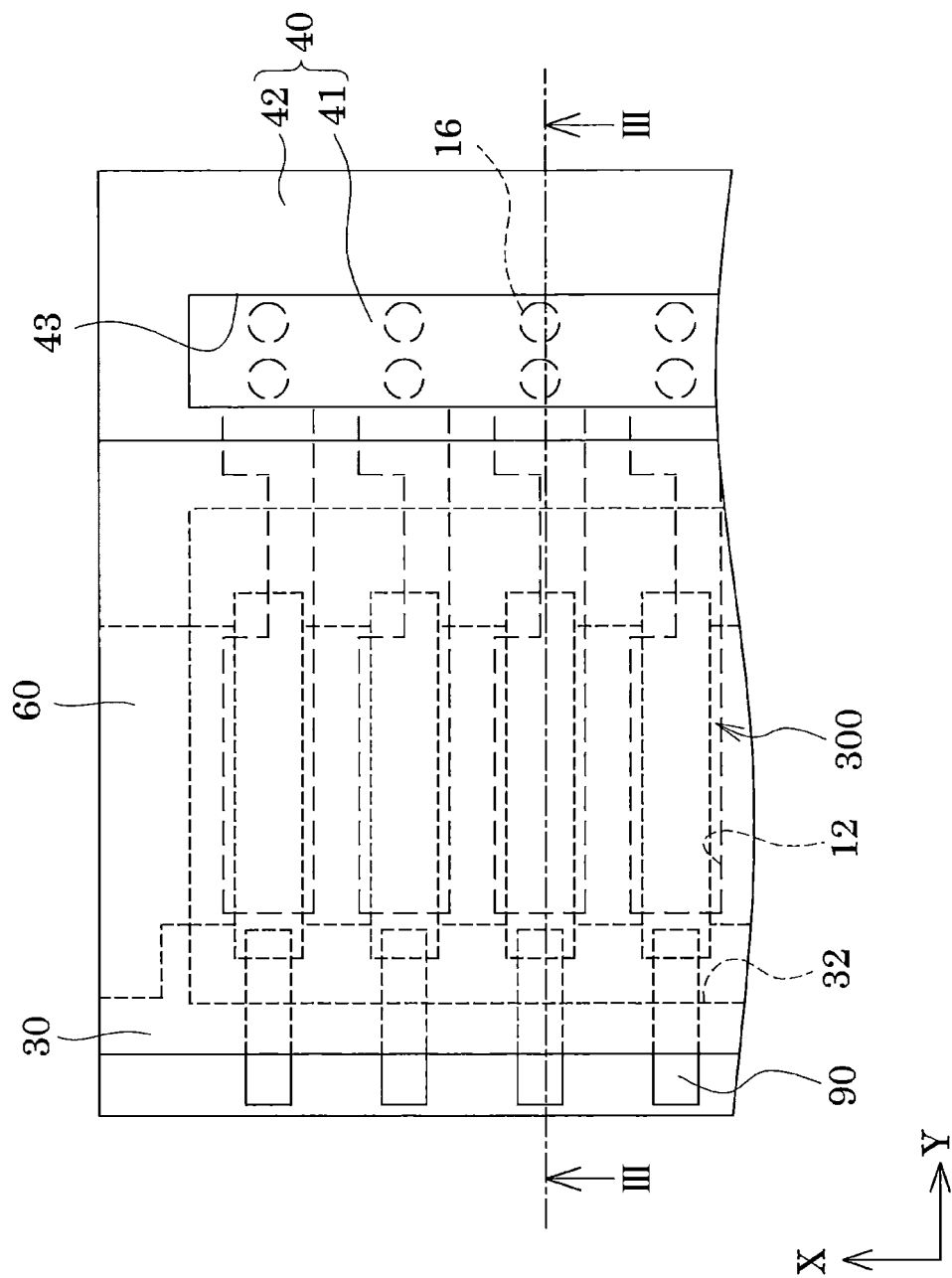
FIG. 2 is a plan view of the recording head.
Figure 3:
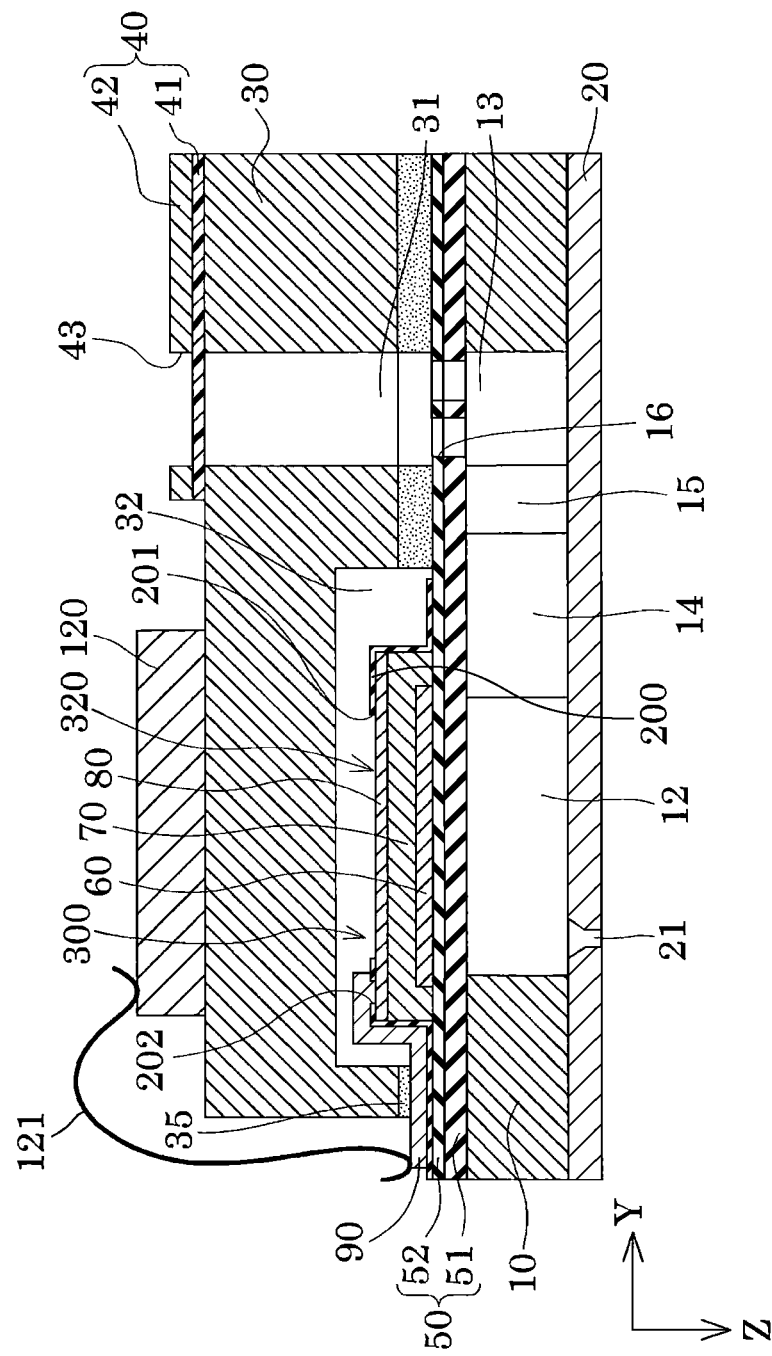
FIG. 3 is a cross-sectional view of the recording head.

FIG. 1 is an exploded perspective view of an ink jet recording head according to an embodiment of the invention, which is an example of a liquid ejecting head, FIG. 2 is a plan view of the ink jet recording head, FIG. 3 is a cross-sectional view taken along line III-III of FIG. 2, and FIG. 4 is an enlarged view of the main portion of FIG. 3.

As illustrated in the figures, a flow-path-forming substrate 10 constituting an ink jet recording head 1 (hereinafter, also simply referred to as a recording head 1) can be formed of a metal such as stainless steel or Ni, a ceramic material such as $ZrO_2$ or $Al_2O_3$, a glass ceramic material, an oxide such as $SiO_2$, MgO, or $LaAlO_3$, or the like. In this embodiment, the flow-path-forming substrate 10 is formed of a single-crystal silicon substrate.

The flow-path-forming substrate 10 is anisotropically etched from one surface side so that pressure-generating chambers 12 partitioned by a plurality of partition walls 11 are parallelly arranged along the first direction X in which a plurality of nozzles 21 for ejecting ink are parallelly arranged. In addition, in the flow-path-forming substrate 10, ink supply paths 14 and communication paths 15 are partitioned by the partition walls 11 on one end side of the pressure-generating chambers 12 in the second direction Y. That is, in this embodiment, the flow-path-forming substrate 10 is provided with the pressure-generating chambers 12, the ink supply paths 14, and the communication paths 15 as individual flow paths communicating with the nozzles 21, respectively.

In addition, at one end of the communication paths 15 in the second direction Y, a communication portion 13 to be a common liquid chamber of each of the pressure-generating chambers 12 is formed. In this embodiment, the communication portion 13 is a liquid supply chamber that supplies ink to the individual flow paths. That is, the flow-path-forming substrate 10 is provided with liquid flow paths including the pressure-generating chambers 12, the communication portion 13, the ink supply paths 14, and the communication paths 15.

The ink supply paths 14 are formed with a narrower width than the pressure-generating chambers 12 in the first direction X and keep the flow path resistance of the ink flowing from the communication portion 13 into the pressure-generating chambers 12 constant. Further, the ink supply paths 14 are not limited to being formed with a narrow width and the height in the third direction Z may be decreased.

A nozzle plate 20 having the nozzles 21 communicating with the vicinity of an end portion of corresponding ones of the pressure-generating chambers 12 on the opposite side to the ink supply paths 14 is fixed by an adhesive, a heat welding film, or the like on the surface side of the flow-path-forming substrate 10 at which the pressure-generating chambers 12 open. Further, the nozzle plate 20 is formed of a glass ceramic, a single-crystal silicon substrate, stainless steel or the like.

On the other hand, a vibration plate 50 is formed on the surface of the flow-path-forming substrate 10 on the opposite side to the nozzle plate 20. The vibration plate 50 of this embodiment includes an elastic film 51 containing silicon oxide provided on the flow-path-forming substrate 10 side and an insulating film 52 containing zirconium oxide provided on the elastic film 51. Further, liquid flow paths such as those of the pressure-generating chambers 12 are formed by anisotropic etching of the flow-path-forming substrate 10 from the surface side of the flow-path-forming substrate 10 to which the nozzle plate 20 is joined and the surface of the pressure-generating chambers 12 on the opposite side to the nozzle plate 20 is defined by the elastic film 51.

Further, the elastic film 51 containing silicon oxide ($SiO_2$) can be formed, for example, by thermally oxidizing the flow-path-forming substrate 10 formed of a single-crystal silicon substrate. In the elastic film 51 containing silicon oxide formed in this way, the internal stress is a compressive stress. That is, in this embodiment, the elastic film 51 is a compressive stress film whose internal stress has compressive stress. In addition, the material of the elastic film 51 which is the compressive stress film is not limited to silicon oxide, and for example, silicon nitride (SiN), titanium oxide ($TiO_x$) or the like may be used. That is, the elastic film 51 is a single layer or a multilayer body of at least one kind of material selected from silicon oxide ($SiO_2$), silicon nitride (SiN), and titanium oxide ($TiO_x$). Of course, the method of manufacturing the elastic film 51 is not limited to the above-mentioned one, and it can also be formed by a gas phase method or a liquid phase method. In addition, the elastic film 51 is not limited to a film having an internal stress that is a compressive stress, and may be a film having an internal stress that is a tensile stress.

The insulating film 52 containing zirconium oxide can be formed by a vapor phase method such as a sputtering method or a chemical vapor deposition method (CVD method) or a liquid phase method such as a sol-gel method, or a metal-organic decomposition (MOD) method.

For example, by forming the insulating film 52 by a gas phase method, it is possible to form a zirconium layer having columnar or nearly columnar crystals (here, collectively referred to as columnar crystals in both cases). Specifically, after forming a zirconium layer formed of zirconium (Zr) by a gas phase method, zirconium oxide ($ZrO_2$) can be formed by thermally oxidizing this zirconium layer. At this time, by adjusting the temperature at the time of thermally oxidizing the zirconium layer, the stress of zirconium oxide can be adjusted, and the tensile stress increases as the sintering temperature is raised. In addition, zirconium oxide may be formed by a reactive sputtering method. In this case, zirconium oxide having a compressive stress is formed. Because the internal stress of the elastic film 51 containing silicon oxide is a compressive stress, by setting the internal stress of the insulating film 52 as a tensile stress and adjusting the tensile stress, the internal stress of the vibration plate 50 around liquid supply ports 16, which will be described in detail later, is made neutral, and the damage to the vibration plate 50 around the liquid supply ports 16 is easily suppressed.

Further, the insulating film 52 deposited by the gas phase method has a crystal structure in which columnar grains are densely assembled, and it is possible to satisfactorily suppress the diffusion of lead (Pb) from a piezoelectric layer 70.

In addition, by forming the insulating film 52 by a liquid phase method, a zirconium oxide layer having granular crystals can be formed. As described above, the insulating film 52 of zirconium oxide formed by the liquid phase method has a tensile stress as an internal stress. In addition, the zirconium oxide layer formed by the liquid phase method can be a flexible film having a crystal structure in which small diameter particles are sparsely assembled and having a small Young's modulus. Therefore, the displacement amount of the insulating film 52, that is, the displacement amount of the vibration plate 50 can be increased. Consequently, it is preferable to include zirconium oxide having granular crystals.

In addition, a zirconium oxide layer formed by a vapor phase method and a zirconium oxide layer formed by a liquid phase method may be combined. Consequently, this makes it easy to adjust the internal stress of the insulating film 52. In other words, by stacking a zirconium oxide layer with a tensile internal stress generated by a vapor phase method and a zirconium oxide layer with a compressive internal stress generated by a liquid phase method, it is also possible to adjust the internal stresses so as to cancel each other. Consequently, the internal stress of the vibration plate 50 around the liquid supply ports 16, which will be described in detail later, is made neutral, and damage to the vibration plate 50 around the liquid supply ports 16 is easily suppressed.

Further, the formation of the zirconium oxide layer having the granular crystals is not limited to a liquid phase method and the zirconium oxide layer having the granular crystals may instead be formed by a gas phase method, in addition, the formation of the zirconium oxide layer having columnar crystals is not limited to a gas phase method and the zirconium oxide layer having columnar crystals may instead be formed by a liquid phase method.

In addition, the insulating film 52 containing zirconium oxide preferably has a tetragonal or cubic crystal structure. That is, it is preferable to use stabilized (partially stabilized) zirconia obtained by adding a rare earth oxide such as yttrium oxide, calcium oxide, magnesium oxide, hafnium oxide or the like to zirconium oxide, more preferably, yttria-stabilized zirconia (YSZ), that is, it is preferable that the insulating film 52 containing zirconium oxide contains yttrium. By using stabilized (partially stabilized) zirconia as described above, tetragonal or cubic crystals are stabilized even at room temperature, the toughness of the insulating film 52 can be further enhanced, the toughness of the vibration plate 50 can be increased, and it is possible to suppress damage to the vibration plate 50 around the liquid supply ports 16, which will be described in detail later.

In addition, in this embodiment, the elastic film 51 and the insulating film 52 are provided as the vibration plate 50; however, the invention is not limited thereto, and only the insulating film 52 may be provided as the vibration plate 50. In addition, another film may be provided in addition to the elastic film 51 and the insulating film 52 serving as the vibration plate 50.

In addition, on the vibration plate 50 of the flow-path-forming substrate 10, a first electrode 60, the piezoelectric layer 70, and a second electrode 80 are stacked by a film deposition and lithography method to form piezoelectric elements 300. In this embodiment, the piezoelectric elements 300 serve as pressure-generating units for generating a pressure change in the ink in the pressure-generating chambers 12. Here, the piezoelectric elements 300 are also referred to as piezoelectric actuators and are units including the first electrode 60, the piezoelectric layer 70, and the second electrode 80. In general, one of the electrodes of the piezoelectric element 300 is used as a common electrode common to the plurality of the piezoelectric elements 300, and the other electrode is configured as an independent individual electrode for each of the piezoelectric elements 300. In this embodiment, the first electrode 60 is used as a common electrode and the second electrode 80 is used as an individual electrode, but these may be reversed.

The first electrode 60 is a material capable of maintaining conductivity without oxidizing when the piezoelectric layer 70 is being deposited, for example, a noble metal such as platinum (Pt) or iridium (Ir), or conductive oxides represented by lanthanum nickel oxide (LNO), iridium oxide ($IrO_2$) and the like, and, furthermore, a multi-layer film formed of the aforementioned may be suitably used.

In addition, as the first electrode 60, an adhesion layer for securing adhesion strength between the above-described conductive material and the vibration plate 50 may be used. In this embodiment, although not specifically illustrated, titanium is used as the adhesion layer. Further, as the adhesion layer, zirconium, titanium, titanium oxide, or the like can be used. That is, in this embodiment, the first electrode 60 is formed of an adhesion layer made of titanium and at least one conductive layer selected from the above-described conductive materials.

The piezoelectric layer 70 is formed of an oxide piezoelectric material having a polarization structure formed on the first electrode 60, for example, the piezoelectric layer 70 can be formed of a perovskite type oxide represented by the general formula $ABO_3$, or a lead-based piezoelectric material containing lead, a lead-free piezoelectric material not containing lead, or the like can be used. The piezoelectric layer 70 can be formed by a liquid phase method such as a sol-gel method or a metal-organic decomposition (MOD) method, a physical vapor deposition (PVD) method (gas phase method) such as a sputtering method or laser ablation method, or the like.

The second electrode 80 is preferably formed of a material capable of satisfactorily forming an interface with the piezoelectric layer 70 and capable of exhibiting conductivity and piezoelectric characteristics, and a noble metal material such as iridium (Ir), platinum (Pt), palladium (Pd), or gold (Au), or a conductive oxide typified by lanthanum nickel oxide (LNO) may be suitably used. In addition, the second electrode 80 may be a multi-layer body formed of a plurality of materials. In this embodiment, a multi-layer electrode of iridium and titanium (where iridium is in contact with the piezoelectric layer 70) is used. The second electrode 80 can be formed by a physical vapor deposition (PVD) method (gas phase method) such as a sputtering method or a laser ablation method, a liquid phase method such as a sol-gel method, a metal-organic decomposition (MOD) method, or a plating method, or the like. In addition, after formation of the second electrode 80, by performing heat treatment, the characteristics of the piezoelectric layer 70 can be improved.

The second electrode 80 such as that described above is formed only on the piezoelectric layer 70, that is, only on the surface of the piezoelectric layer 70 on the opposite side to the flow-path-forming substrate 10.

In addition, the piezoelectric element 300 is covered with a protective film 200. As the protective film 200, an insulating material having moisture resistance can be used. In this embodiment, the protective film 200 is provided so as to cover the side surface of the piezoelectric layer 70, and the side surface and peripheral portion of the upper surface of the second electrode 80. That is, the protective film 200 is not provided in the main portion of the second electrode 80, which is the substantially central region of the upper surface of the second electrode 80, and an opening portion 201 that exposes the main portion of the second electrode 80 is provided.

The opening portion 201 is an opening that opens in a rectangular shape along the second direction Y of the piezoelectric element 300 by penetrating the protective film 200 in the third direction Z, which is the thickness direction; for example, the opening portion 201 can be formed by forming the protective film 200 over the entire surface of the flow-path-forming substrate 10 and patterning the protective film 200.

By covering the side surface of the piezoelectric layer 70 of the piezoelectric element 300 with the protective film 200 as described above, leakage of current between the first electrode 60 and the second electrode 80 can be suppressed and damage to the piezoelectric element 300 can be suppressed. In addition, by providing the opening portion 201, it is possible to restrain the displacement of the piezoelectric element 300 from being significantly lowered by the protective film 200. As a material of the protective film 200 such as that described above, any material having moisture resistance may be used, and an inorganic insulating material, an organic insulating material, or the like can be used.

Examples of the inorganic insulating material usable as the protective film 200 include silicon oxide ($SiO_x$), zirconium oxide ($ZrO_x$), tantalum oxide ($TaO_x$), aluminum oxide ($AlO_x$), and titanium oxide ($TiO_x$). As the inorganic insulating material of the protective film, in particular, aluminum oxide ($AlO_x$), which is an inorganic amorphous material, for example, alumina ($Al_2O_3$), is preferably used. Further, the protective film 200 formed of an inorganic insulating material can be formed by, for example, an MOD method, a sol-gel method, a sputtering method, a CVD method, or the like.

In addition, as the organic insulating material usable as the protective film 200, for example, at least one selected from an epoxy resin, a polyimide resin, a silicone resin, and a fluorine resin can be used. Further, the protective film 200 formed of an organic insulating material can be formed by, for example, a spin coating method, a spray method, or the like.

A lead electrode 90 formed of, for example, gold (Au) or the like is provided on the protective film 200. One end of the lead electrode 90 is connected to the second electrode 80 via a communication hole 202 provided in the protective film 200 and the other end thereof extends to an end portion of the flow-path-forming substrate 10 on the opposite side to the ink supply path 14, and the extended tip portion is connected to a drive circuit 120 that drives the piezoelectric element 300, which will be described later, via a connection wire 121.

Furthermore, a protective substrate 30 having a manifold portion 31 for supplying ink to the communication portion 13 is joined to the surface of the flow-path-forming substrate 10 on the piezoelectric element 300 side. In this embodiment, the flow-path-forming substrate 10 and the protective substrate 30 are joined using an adhesive 35. The manifold portion 31 of the protective substrate 30 communicates with the communication portion 13 via a plurality of the liquid supply ports 16, and the ink from the manifold portion 31 is supplied to the communication portion 13 via the plurality of the liquid supply ports 16.

A plurality of the liquid supply ports 16 that supply the ink from the manifold portion 31 to the communication portion 13 are provided in the vibration plate 50.

Each of the liquid supply ports 16 has an opening smaller than the opening on the communication portion 13 side of the manifold portion 31 and at least two or more liquid supply ports 16 are provided. Here, "a plurality of the liquid supply ports 16 are provided" means that two or more liquid supply ports 16 are provided for one communication portion 13. For example, in the case where two or more communication portions 13 are provided in the flow-path-forming substrate 10, it is sufficient for a plurality of the liquid supply ports 16 to be provided for each of the communication portions 13. That is, although a plurality of the liquid supply ports 16 are provided in the vibration plate 50, the case where one liquid supply port 16 is provided for one communication portion 13 is not included in the meaning of "plurality of supply ports" of the invention. By providing two or more liquid supply ports 16 in one communication portion 13, the vibration plate 50 is provided in the form of a canopy over the opening of the communication portion 13 on the protective substrate 30 side.

The liquid supply ports 16 such as those described above penetrate the vibration plate 50. Here, "the liquid supply ports 16 penetrate the vibration plate 50" means that the insulating film 52 containing zirconium oxide that forms the vibration plate 50 is provided at least in a portion around the liquid supply ports 16. That is, "the insulating film 52 containing zirconium oxide that forms the vibration plate 50 is provided at least in a portion around the liquid supply ports 16" refers to a configuration in which the insulating film 52 that forms the vibration plate 50 is continuously provided in the circumferential direction of one liquid supply port 16 as well as a configuration in which the insulating film 52 that forms the vibration plate 50 is provided discontinuously in the circumferential direction of one liquid supply port 16. In addition, "the insulating film 52 is provided at least in a portion around the liquid supply ports 16" refers to a configuration in which the insulating film 52 forms a portion of the opening edge portion of the liquid supply ports 16, a configuration in which the insulating film 52 is formed in a portion between adjacent ones of the liquid supply ports 16, and a configuration in which the insulating film 52 is formed in a portion between the liquid supply ports 16 and the flow path wall. In this embodiment, the elastic film 51 and the insulating film 52 are continuously formed in the peripheral edge of the opening edge portion of the liquid supply ports 16.

The vibration plate 50 provided with a plurality of the liquid supply ports 16 functions as a filter that captures foreign bodies such as bubbles and dust contained in the ink when supplying ink from the manifold portion 31 to the communication portion 13. Because the vibration plate 50 that is provided with the plurality of the liquid supply ports 16 and that functions as a filter in this way, is provided in an eaves shape at the opening of the communication portion 13 on the protective substrate 30 side, it is not supported by the flow-path-forming substrate 10 when pressure is applied by the ink supplied from the manifold portion 31 to the communication portion 13. However, by using the insulating film 52 containing zirconium oxide having high toughness as the vibration plate 50, even if the vibration plate 50 that is provided in the opening of the communication portion 13 flexes, it is possible to suppress the occurrence of damage such as cracks in the vibration plate 50. In particular, in this embodiment, the insulating film 52 containing zirconium oxide that forms the vibration plate 50 is continuously formed in the circumferential direction of the liquid supply ports 16. By providing the insulating film 52 continuously in the circumferential direction of the liquid supply ports 16 in such a manner, it is possible to further suppress the formation of cracks in the vibration plate 50 over the entire circumference in the circumferential direction of the liquid supply ports 16. In the case where a vibration plate having low toughness is provided in a region where the communication portion 13 and the manifold portion 31 communicate with each other and the liquid supply ports 16 are provided in the vibration plate 50, the internal stress of the vibration plate 50 and the pressure of the ink causes damage such as cracks in the vibration plate 50. In this embodiment, by using the insulating film 52 containing zirconium oxide having high toughness for the vibration plate 50 provided in the region where the communication portion 13 and the manifold portion 31 communicate with each other, damage such as cracks and the like in the vibration plate 50 due to the internal stress of the vibration plate 50 and ink pressure can be suppressed. Therefore, it is possible to realize the recording head 1 with high reliability.

Here, the fracture toughness values of zirconium oxide, silicon nitride, and silicon oxide are shown in Table 1 below.

TABLE 1

| Vibration Plate Material | Fracture Toughness Value [MPa · m$^{0.5}$] |
| --- | --- |
| Zirconium Oxide (ZrO$_2$) | 7 to 8 |
| Silicon Nitride (Si$_3$N$_4$) | 5 |
| Silicon Oxide (SiO$_2$) | 3 |

As illustrated in Table 1, the toughness of zirconium oxide is larger than that of silicon nitride or silicon oxide. Therefore, by using the insulating film 52 containing zirconium oxide having high toughness for the vibration plate 50 provided in the region where the communication portion 13 and the manifold portion 31 communicate with each other, damage such as cracks and the like in the vibration plate 50 due to the internal stress of the vibration plate 50 and ink pressure can be suppressed.

In addition, in this embodiment, because the insulating film 52 containing zirconium oxide is used as the vibration plate 50, it is not necessary to form the vibration plate 50 to be relatively thick with a three-layer to ten-layer multi-layer structure and it is possible to restrain the vibration plate 50 from impeding the displacement of the piezoelectric element 300.

By making the vibration plate 50 under the piezoelectric element 300 and the vibration plate 50 forming the liquid supply ports 16 different materials or different multi-layer structures, although damage to the vibration plate 50 in the portion where the liquid supply ports 16 are formed can be suppressed, the manufacturing process is lengthened and the cost is increased. In this embodiment, by providing the portion of the vibration plate 50 overlapping with the piezoelectric element 300 and the portion of the vibration plate 50 where the liquid supply ports 16 are formed when viewed in plan from the third direction Z continuously in the same layer, an increase in the number of manufacturing operations can be suppressed, and the cost can be reduced.

In addition, because the vibration plate 50 has high toughness by using the insulating film 52 containing zirconium oxide, even if the vibration plate 50 around the liquid supply ports 16 is flexed by the pressure fluctuation in the communication portion 13, cracks are unlikely to occur. Therefore, the vibration plate 50 around the liquid supply ports 16 can be flexed by pressure change in the communication portion 13, and the pressure fluctuation in the communication portion 13 can be absorbed. Therefore, it is also possible to reduce the size of or eliminate the compliance portion to be described later in detail.

Further, in this embodiment, the flow-path-forming substrate 10, the vibration plate 50, and the piezoelectric element 300 provided in the pressure-generating chamber 12 and the like are collectively referred to as a piezoelectric device.

On the other hand, a piezoelectric-element-holding portion 32 is provided in a region of the protective substrate 30 that faces the piezoelectric element 300. Because the piezoelectric element 300 is formed in the piezoelectric-element-holding portion 32, the piezoelectric element 300 is protected in a state in which it is hardly affected by the external environment. Further, the piezoelectric-element-holding portion 32 may be sealed or not sealed.

As a material of the protective substrate 30 such as that described above, for example, a glass, a ceramic material, a metal, a resin, or the like can be used, for example, it is preferable that the protective substrate 30 be formed of a material having substantially the same thermal expansion coefficient as that of the flow-path-forming substrate 10; in this embodiment, a single-crystal silicon substrate, which is the same material as the flow-path-forming substrate 10, is used.

In addition, the drive circuit 120 for driving the piezoelectric element 300 is provided on the protective substrate 30. As the drive circuit 120, for example, a circuit board, a semiconductor integrated circuit (IC), or the like can be used. The drive circuit 120 and the lead electrode 90 are electrically connected to each other through the connection wire 121 formed of a conductive wire such as a bonding wire.

Furthermore, a compliance substrate 40 formed of a sealing film 41 and a fixing plate 42 is joined to a region of the protective substrate 30 corresponding to the manifold portion 31. The sealing film 41 is formed of a material having low rigidity and flexibility (for example, a polyphenylene sulfide (PPS) film having a thickness of 6 μm), and one surface of the manifold portion 31 is sealed by the sealing film 41. In addition, the fixing plate 42 is formed of a hard material such as a metal (for example, stainless steel (SUS) having a thickness of 30 μm or the like). Because the area of the fixing plate 42 facing the manifold portion 31 is an opening portion 43 completely removed in the thickness direction, one surface of the manifold portion 31 is a compliance portion sealed only with the sealing film 41 that is flexible.

In the ink jet recording head 1 of this embodiment such as that described above, ink is taken in from an external ink supply unit (not illustrated), the interior of each of the pressure-generating chambers 12 is filled with ink from the manifold portion 31 to the nozzle 21, and then, in accordance with the recording signal from the drive circuit 120, a voltage is applied between the first electrode 60 and the second electrode 80 corresponding to the pressure-generating chamber 12, and, by bending and deforming the piezoelectric element 300 and the vibration plate 50, the pressure in the pressure-generating chamber 12 increases, and ink is discharged from the nozzle 21.

As described above, in this embodiment, a piezoelectric device for use in the recording head 1 which is an example of a liquid ejecting head for ejecting ink as a liquid from the nozzles 21 includes the flow-path-forming substrate 10 that forms individual liquid chambers including the pressure-generating chambers 12 that communicate with the nozzles 21, and the communication portion 13, which serves as a liquid supply chamber communicating with individual flow paths, the vibration plate 50 formed at a position corresponding to the individual liquid chambers including the pressure-generating chambers 12 and the communication portion 13 of the flow-path-forming substrate 10, a plurality of the liquid supply ports 16 formed in the communication portion 13, the piezoelectric elements 300 each including the first electrode 60, the piezoelectric layer 70, and the second electrode 80, the piezoelectric elements 300 being formed at a position on the vibration plate 50 corresponding to the individual liquid chambers including the pressure-generating chambers 12, where the liquid supply ports 16 are provided so as to penetrate the vibration plate 50, and the vibration plate 50 contains zirconium oxide.

By providing the vibration plate 50 including zirconium oxide as the vibration plate 50 provided with the plurality of the liquid supply ports 16 in this manner, it is possible to improve the toughness of the vibration plate 50 and to suppress the occurrence of damage such as cracks and the like in the vibration plate 50 around the plurality of the liquid supply ports 16. In addition, because the vibration plate 50 can be made thinner as compared with stacking the vibration plate 50 in multiple layers such as 3 to 10 layers, it is possible to restrain the vibration plate 50 from impeding the flexure of the piezoelectric element 300 and to suppress the decrease in the displacement of the piezoelectric element 300.

In addition, in this embodiment, at a position of the vibration plate 50 corresponding to the communication portion 13, the crystal structure of zirconium oxide preferably contains tetragonal crystals or cubic crystals. In particular, it is preferable that the vibration plate 50 further contain yttrium at a position of the vibration plate 50 corresponding to the communication portion 13. That is, by using stabilized (partially stabilized) zirconia as the vibration plate 50, the tetragonal system or the cubic system can be stabilized even at room temperature, the toughness of the vibration plate 50 can be further enhanced, and it is possible to suppress damage to the vibration plate 50 around the liquid supply ports 16.

In addition, it is preferable that the vibration plate 50, at a position corresponding to the communication portion 13, have the elastic film 51, which is a compressive stress film in which the internal stress is a compressive stress, and the liquid supply ports 16 penetrate the vibration plate 50 having the elastic film 51. Accordingly, by providing the elastic film 51, which has a compressive stress as the internal stress, in the vibration plate 50, the internal stress of the vibration plate 50 around the liquid supply ports 16 can be adjusted and it is possible to further suppress damage, such as cracks and the like, to the vibration plate 50 around the liquid supply ports.

In addition, the zirconium oxide preferably contains granular crystals. Accordingly, the zirconium oxide can be made to be a flexible film having a small Young's modulus, and the displacement amount of the vibration plate 50 can be increased.

In addition, it is preferable that the vibration plate 50 have the elastic film 51 which is a film containing zirconium oxide and the elastic film 51 be continuously formed in the circumferential direction of the liquid supply ports 16. That is, it is preferable that the elastic film 51 containing zirconium oxide forming the vibration plate 50 be continuously formed in the circumferential direction of the liquid supply ports 16. Accordingly, by providing the vibration plate 50, particularly the insulating film 52 continuously around the liquid supply ports 16, it is possible to further suppress the formation of cracks in the vibration plate 50 around the liquid supply ports 16.

Other Embodiments

Although an embodiment of the invention has been described above, the basic configuration of the invention is not limited to that described above.

In addition, for example, in the embodiment described above, a configuration in which the protective film 200 that covers the piezoelectric element 300 is not provided in the region where the liquid supply ports 16 are formed is exemplified, but this invention is not limited thereto and the protective film 200 may be provided in the region where the liquid supply ports 16 are provided. That is, in the region between the manifold portion 31 and the communication portion 13, the vibration plate 50, and the protective film 200 are stacked, and the liquid supply ports 16 may be provided so as to penetrate through the vibration plate 50, and the protective film 200.

In addition, in the above-described embodiment, the communication portion 13, which is the liquid supply chamber, is provided so as to communicate with all the individual flow paths in common, but this invention is not particularly limited thereto and the communication portion 13 may be provided for each individual flow path or it may be provided so as to communicate with a group of two or more individual flow paths. However, even when the communication portion 13 is provided for each individual flow path, there is no limitation regarding the communication portion 13 as long as two or more liquid supply ports 16 are provided for each communication portion 13. In addition, in the case where the communication portion 13 communicates with each individual flow path or each group of two or more individual flow paths, because the flow path resistance is dictated by the liquid supply port 16, for example, the ink supply paths 14 and the communication paths 15 need not be provided in the flow-path-forming substrate 10. Of course, in each of the above-described embodiments, at least one of the ink supply paths 14 and the communication paths 15 may be omitted.

Furthermore, in the above-described embodiment, the configuration in which the vibration plate 50 is deposited on the flow-path-forming substrate 10 has been exemplified, but it is not particularly limited thereto, and the vibration plate 50 may be joined to the flow-path-forming substrate 10.

In addition, in the above-described embodiment, the piezoelectric element 300 of the thin-film type is used as a pressure-generating element that causes a pressure change in the pressure-generating chambers 12; however, the invention is not limited thereto, and, for example, a thick-film piezoelectric element formed by a method such as attaching a green sheet or the like, a longitudinal vibration type piezoelectric element in which a piezoelectric material and an electrode forming material are alternately stacked and which expands and contracts in the axial direction, or the like can be used.

Figure 5:
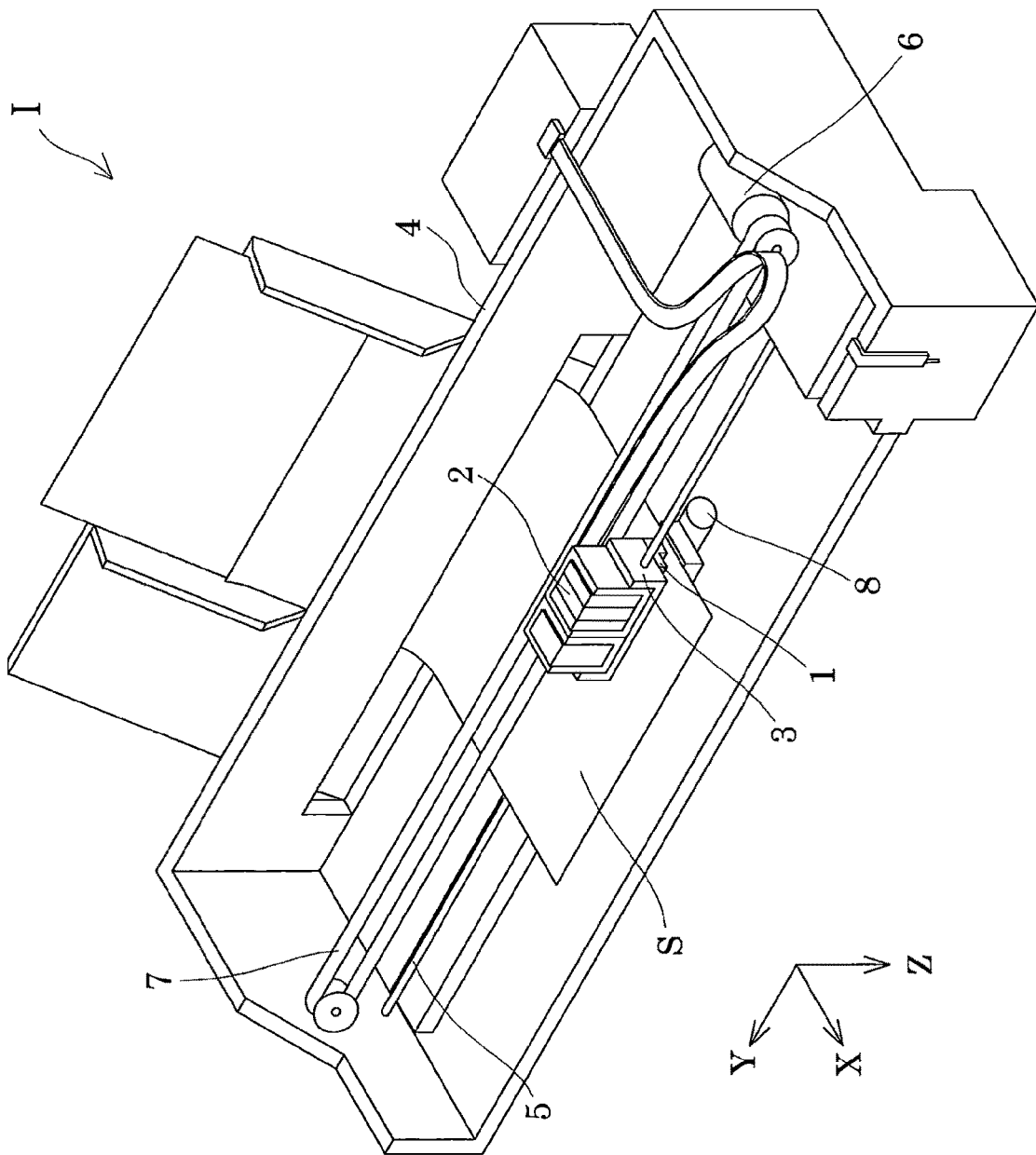
FIG. 5 is a diagram illustrating a schematic configuration of a recording apparatus.

In addition, the ink jet recording head 1 constitutes a unit of an ink jet recording head unit having ink flow paths communicating with ink cartridges or the like, and is mounted in an ink jet recording apparatus. FIG. 5 is a schematic diagram illustrating an example of an ink jet recording apparatus.

In the ink jet recording apparatus I illustrated in FIG. 5, a plurality of the recording heads 1 are detachably provided with ink cartridges 2 constituting ink supply units, and a carriage 3 on which the recording heads 1 are mounted is attached to an apparatus main body 4 and is provided so as to be movable in the axial direction on a carriage shaft 5.

The driving force of a driving motor 6 is transmitted to the carriage 3 through a plurality of gears (not illustrated) and a timing belt 7, whereby the carriage 3 on which the recording head 1 is mounted is moved along the carriage shaft 5. On the other hand, the apparatus main body 4 is provided with a transport roller 8 as a mode of transport, and a recording sheet S, which is a recording medium such as paper, is transported by the transport roller 8. Further, the mode of transport for transporting the recording sheet S is not limited to a transport roller and may be a belt, a drum, or the like.

Further, in the above-described ink jet recording apparatus I, the ink cartridges 2 as ink supply units are mounted on the carriage 3, but the invention is not particularly limited thereto, and for example, an ink supply unit such as an ink tank may be fixed to the apparatus main body 4 and the ink supply unit and the recording head 1 may be connected via a supply pipe such as a tube. In addition, the ink supply unit need not be mounted in the ink jet recording apparatus.

In addition, in the ink jet recording apparatus I described above, the recording heads 1 are mounted on the carriage 3 and move in the main scanning direction; however, this invention is not limited thereto, for example, the invention can also be applied to a so-called line type recording apparatus in which the recording heads 1 are fixed and printing is performed by simply moving the recording sheet such as paper in the sub-scanning direction.

Furthermore, the invention is broadly applicable to liquid ejecting heads in general, and is used for manufacturing recording heads such as various ink jet recording heads used in image recording apparatuses such as printers, color material ejecting heads used for manufacturing color filters of liquid crystal displays and the like, electrode material ejecting heads used for forming electrodes of organic EL displays, field emission displays (FEDs), and the like, bioorganic material ejecting heads used for manufacturing biochips, and the like. In addition, although the ink jet recording apparatus I has been described as an example of a liquid ejecting apparatus, it can also be used as a liquid ejecting apparatus using another of the above-described liquid ejecting heads.

The entire disclosure of Japanese Patent Application No. 2017-132519, filed Jul. 6, 2017 and No. 2018-78914, filed Apr. 17, 2018 are expressly incorporated by reference herein.

What is claimed is:

1. A piezoelectric device used in a liquid ejecting head that ejects a liquid from a nozzle, comprising:
   a flow-path-forming substrate in which an individual liquid chamber that communicates with the nozzle and a liquid supply chamber that communicates with the individual liquid chamber are formed,
   a vibration plate formed at a position corresponding to the individual liquid chamber and the liquid supply chamber of the flow-path-forming substrate,
   a plurality of liquid supply ports formed in the vibration plate and positioned between a communication portion of a manifold and the liquid supply chamber, wherein the liquid flows from an opening in the communication portion into an opening of the liquid supply chamber through the plurality of liquid supply ports formed in the vibration plate, wherein an opening of each of the liquid supply ports is smaller than the opening of the communication portion; and
   a piezoelectric element including a first electrode, a piezoelectric layer, and a second electrode, the piezoelectric element being formed at a position on the vibration plate corresponding to the individual liquid chamber,
   wherein the liquid supply ports are provided so as to penetrate the vibration plate such that the liquid flows from the communication portion to the liquid supply chamber through the liquid supply ports, and
   wherein the vibration plate contains zirconium oxide.

2. The piezoelectric device according to claim 1, wherein a crystal structure of the zirconium oxide includes a tetragonal crystal or a cubic crystal.

3. The piezoelectric device according to claim 2, wherein the vibration plate further contains yttrium.

4. The piezoelectric device according to claim 1, wherein the vibration plate, at a position corresponding to the liquid supply chamber, has a compressive stress film in which an internal stress is a compressive stress, and
   wherein the liquid supply ports are provided so as to penetrate the vibration plate having the compressive stress film.

5. The piezoelectric device according to claim 1, wherein the zirconium oxide contains granular crystals.

6. The piezoelectric device according to claim 1, wherein the vibration plate includes a film containing the zirconium oxide and the film containing the zirconium oxide is continuously formed on at least the portion of the vibration plate positioned between the manifold and the liquid supply chamber.

7. A liquid ejecting head comprising the piezoelectric device according to claim 1.

8. A liquid ejecting head comprising the piezoelectric device according to claim 2.

9. A liquid ejecting head comprising the piezoelectric device according to claim 3.

10. A liquid ejecting head comprising the piezoelectric device according to claim 4.

11. A liquid ejecting head comprising the piezoelectric device according to claim 5.

12. A liquid ejecting head comprising the piezoelectric device according to claim 6.

13. A liquid ejecting apparatus comprising the liquid ejecting head according to claim 7.

14. A liquid ejecting apparatus comprising the liquid ejecting head according to claim 8.

15. A liquid ejecting apparatus comprising the liquid ejecting head according to claim 9.

16. A liquid ejecting apparatus comprising the liquid ejecting head according to claim 10.

17. A liquid ejecting apparatus comprising the liquid ejecting head according to claim 11.

18. A liquid ejecting apparatus comprising the liquid ejecting head according to claim 12.

19. The piezoelectric device according to claim 4,
   wherein the vibration plate, at a position corresponding to the liquid supply chamber, includes a tensile stress film in which an internal stress is a tensile stress, and
   wherein the liquid supply ports are provided so as to penetrate the vibration plate, which includes the tensile stress film.

20. The piezoelectric device according to claim 1, wherein the zirconium oxide is deposited by a gas phase method.

* * * * *